(12) United States Patent
Cho et al.

(10) Patent No.: US 8,017,485 B2
(45) Date of Patent: Sep. 13, 2011

(54) METHODS OF FABRICATING A SEMICONDUCTOR DEVICE

(75) Inventors: Du-Hyun Cho, Yongin-si (KR);
Tae-Hyuk Ahn, Yongin-si (KR);
Sang-Sup Jeong, Suwon-si (KR);
Jin-Hyuk Yoo, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 12/588,564

(22) Filed: Oct. 20, 2009

(65) Prior Publication Data
US 2010/0099248 A1 Apr. 22, 2010

(30) Foreign Application Priority Data
Oct. 20, 2008 (KR) .................. 10-2008-0102436

(51) Int. Cl.
*H01L 21/336* (2006.01)
(52) U.S. Cl. ........ 438/288; 438/287; 438/591; 438/595; 257/E21.18; 257/E21.21; 257/E21.679
(58) Field of Classification Search .................. 438/367, 438/446, 288, 304, 366; 257/E21.18
See application file for complete search history.

(56) References Cited

U.S. PATENT DOCUMENTS

| | | | |
|---|---|---|---|
| 6,642,107 B2 | 11/2003 | Seo et al. | |
| 2004/0197995 A1* | 10/2004 | Lee et al. | 438/257 |
| 2005/0245028 A1* | 11/2005 | Lee | 438/257 |
| 2009/0224306 A1* | 9/2009 | Hayashi | 257/316 |

FOREIGN PATENT DOCUMENTS

| | | |
|---|---|---|
| JP | 2003-115552 | 4/2003 |
| KR | 10-0393229 | 7/2003 |
| KR | 10-0673225 | 1/2007 |
| KR | 10-2007-0113496 | 11/2007 |

OTHER PUBLICATIONS

An English language abstract of Korean Publication No. KR 10-2003-0014499, published Feb. 19, 2003.
An English language abstract of Korean Publication No. KR 10-2004-0058989, published Jul. 5, 2004.

* cited by examiner

*Primary Examiner* — Cheung Lee
(74) *Attorney, Agent, or Firm* — Harness, Dickey & Pierce, P.L.C.

(57) ABSTRACT

Methods of fabricating a semiconductor device are provided, the methods include forming a first dielectric layer, a data storage layer, and a second dielectric layer, which are sequentially stacked, on a semiconductor substrate. A mask having a first opening exposing a first region of the second dielectric layer is formed on the second dielectric layer. A gate electrode filling at least a portion of the first opening is formed. A second opening exposing a second region of the second dielectric layer is formed by etching the mask such that the second region is spaced apart from the first region. A second dielectric pattern and a data storage pattern are formed by sequentially etching the exposed second region of the second dielectric layer and the data storage layer. The second dielectric pattern is formed to have a greater width than a lower surface of the gate electrode.

18 Claims, 7 Drawing Sheets

METHODS OF FABRICATING A SEMICONDUCTOR DEVICE

FOREIGN PRIORITY STATEMENT

This application claims the benefit of priority under 35 U.S.C. §119 to Korean Patent Application No. 10-2008-0102436, filed on Oct. 20, 2008 in the Korean Intellectual Property Office (KIPO), the entire contents of which are hereby incorporated herein by reference.

BACKGROUND

1. Field

Example embodiments relate to methods of fabricating a semiconductor device, and more particularly, to methods of fabricating a semiconductor device having a data storage pattern.

2. Description of Related Art

A semiconductor device may include a volatile memory device such as a DRAM device and a non-volatile memory device such as a flash memory device. A flash memory device is characterized in that it maintains data stored in flash memory cells even if power is turned off.

SUMMARY

Example embodiments relate to methods of fabricating a semiconductor device, more particularly, to methods of fabricating a semiconductor device having a data storage pattern.

According to an example embodiment, a method of fabricating a semiconductor device is provided. The method includes forming a first dielectric layer, a data storage layer, and a second dielectric layer, which are sequentially stacked, on a semiconductor substrate. A mask having a first opening exposing a first region of the second dielectric layer is formed on the second dielectric layer. A gate electrode filling at least a portion of the first opening is formed. A second opening exposing a second region of the second dielectric layer is formed by etching the mask, wherein the second region is spaced apart from the first region. A second dielectric pattern and a data storage pattern are formed by sequentially etching the exposed second region of the second dielectric layer and the data storage layer, wherein the second dielectric pattern has a greater width than a lower surface of the gate electrode.

The data storage layer may be a charge trap layer of a non-volatile memory device.

At least one of the first and second openings may have an inclined sidewall that narrows from an upper region towards a lower region. One of the first and second openings may have an inclined sidewall that narrows from an upper region towards a lower region, and the other may have a substantially vertical sidewall.

The method may further include forming an insulating spacer on a sidewall of the first opening.

The method may further include forming a buffer layer on the second dielectric layer before forming the mask.

Forming the first opening may include etching the mask by performing a first etching process in which the buffer layer is used as an etch stop layer, and etching the buffer layer by performing a second etching process in which the second dielectric layer is used as an etch stop layer.

The first etching process may be performed using at least one of dry etching and wet etching, and the second etching process may be performed using wet etching.

The method may further include etching the data storage pattern such that the data storage pattern has a smaller width than the second dielectric pattern.

While forming the second opening, a portion of the mask may remain. A gate spacer, which surrounds a sidewall of the gate electrode, may be formed from the remaining portion of the mask.

According to still another example embodiment, another method of fabricating a semiconductor device is provided. The method including forming a first dielectric layer, a data storage layer, and a second dielectric layer, which are sequentially stacked, over a semiconductor substrate. A mask is formed over the second dielectric layer, and subsequently patterned to form a mask pattern that exposes a first region of the second dielectric layer. A gate electrode is formed over the exposed first region of the second dielectric layer. An upper surface of the gate electrode may be greater than a lower surface of the gate electrode. The mask pattern is partially removed to expose a second region of the second dielectric layer. The second region of the second dielectric layer is spaced apart from the first region. A second dielectric pattern and a data storage pattern may be formed by removing portions of the second dielectric layer and the data storage layer in the second region. The second dielectric pattern may have a greater width than the lower surface of the gate electrode. Sidewalls of the gate electrode may not be parallel to each other.

BRIEF DESCRIPTION OF THE DRAWINGS

Example embodiments are described in further detail below with reference to the accompanying drawings. The accompanying drawings are intended to depict example embodiments and should not be interpreted to limit the intended scope of the claims. The accompanying drawings are not to be considered as drawn to scale unless explicitly noted. FIGS. 1-4D represent non-limiting, example embodiments as described herein.

DETAILED DESCRIPTION OF EXAMPLE EMBODIMENTS

Various example embodiments will now be described more fully with reference to the accompanying drawings in which some example embodiments are shown. However, specific structural and functional details disclosed herein are merely representative for purposes of describing example embodiments. Thus, the invention may be embodied in many alternate forms and should not be construed as limited to only example embodiments set forth herein. Therefore, it should be understood that there is no intent to limit example embodiments to the particular forms disclosed, but on the contrary, example embodiments are to cover all modifications, equivalents, and alternatives falling within the scope of the invention.

Although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that, if an element is referred to as being "connected" or "coupled" to another element, it can be directly connected, or coupled, to the other element or intervening elements may be present. In contrast, if an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," if used herein, specify the presence of stated features, integers, steps, operations, elements and/or components, but do not preclude the presence or addition of one or more other features, integers, steps, operations, elements, components and/or groups thereof.

Spatially relative terms (e.g., "beneath," "below," "lower," "above," "upper" and the like) may be used herein for ease of description to describe one element or a relationship between a feature and another element or feature as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, for example, the term "below" can encompass both an orientation that is above, as well as, below. The device may be otherwise oriented (rotated 90 degrees or viewed or referenced at other orientations) and the spatially relative descriptors used herein should be interpreted accordingly.

Example embodiments are described herein with reference to cross-sectional illustrations that are schematic illustrations of idealized embodiments (and intermediate structures). As such, variations from the shapes of the illustrations as a result, for example, of manufacturing techniques and/or tolerances, may be expected. Thus, example embodiments should not be construed as limited to the particular shapes of regions illustrated herein but may include deviations in shapes that result, for example, from manufacturing. For example, an implanted region illustrated as a rectangle may have rounded or curved features and/or a gradient (e.g., of implant concentration) at its edges rather than an abrupt change from an implanted region to a non-implanted region. Likewise, a buried region formed by implantation may result in some implantation in the region between the buried region and the surface through which the implantation may take place. Thus, the regions illustrated in the figures are schematic in nature and their shapes do not necessarily illustrate the actual shape of a region of a device and do not limit the scope.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

Example embodiments relate to methods of fabricating a semiconductor device, and more particularly, to methods of fabricating a semiconductor device having a data storage pattern.

Figure 1:
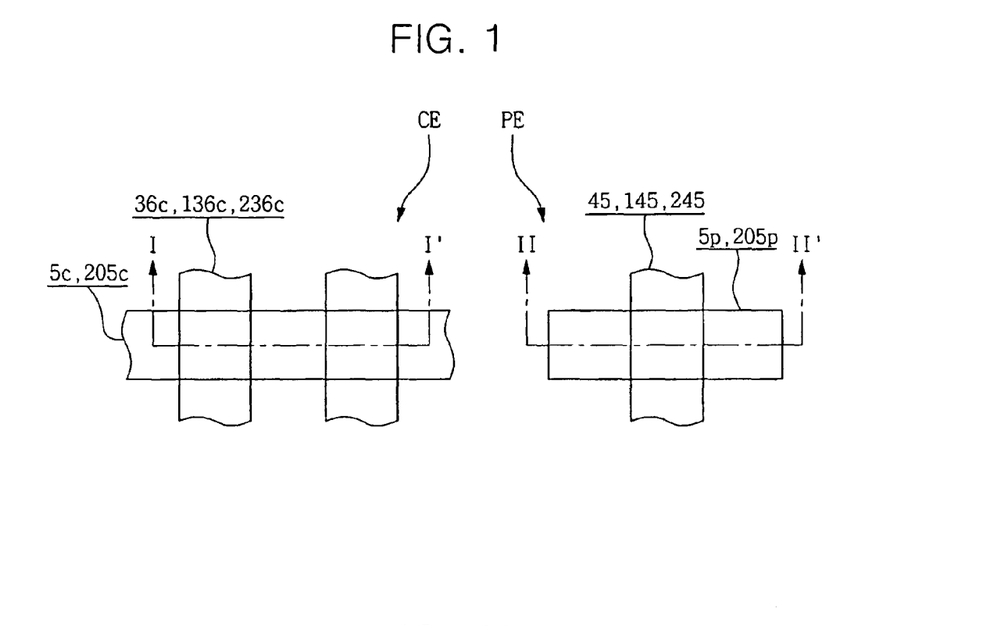
FIG. 1 is a plan view of a semiconductor device according to example embodiments.

FIG. 1 is a plan view of a semiconductor device according to example embodiments. FIGS. 2A to 2G are cross-sectional views of a semiconductor device according to an example embodiment. FIGS. 3A and 3B are cross-sectional views of a semiconductor device according to another example embodiment. FIGS. 4A to 4D are cross-sectional views of a semiconductor device according to still another example embodiment. In FIGS. 2A to 4D, a portion represented by C denotes a region taken along line I-I' of FIG. 1, and a portion represented by P denotes a region taken along line II-II' of FIG. 1.

First, a method of fabricating a semiconductor device according to an example embodiment will be described below with reference to FIGS. 1 and 2A to 2G.

Figure 2A:
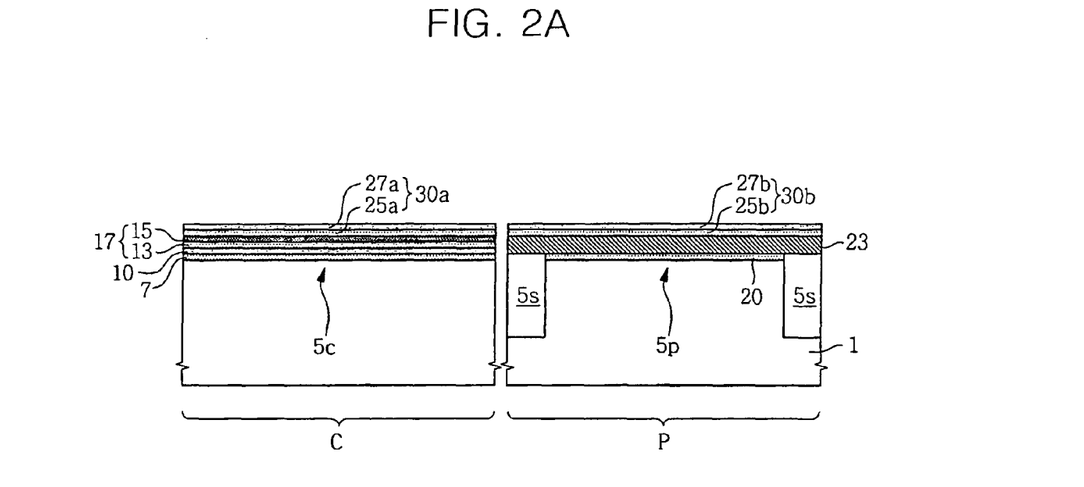
FIGS. 2A to 2G are cross-sectional views of a semiconductor device according to an example embodiment.
Figure 3A:
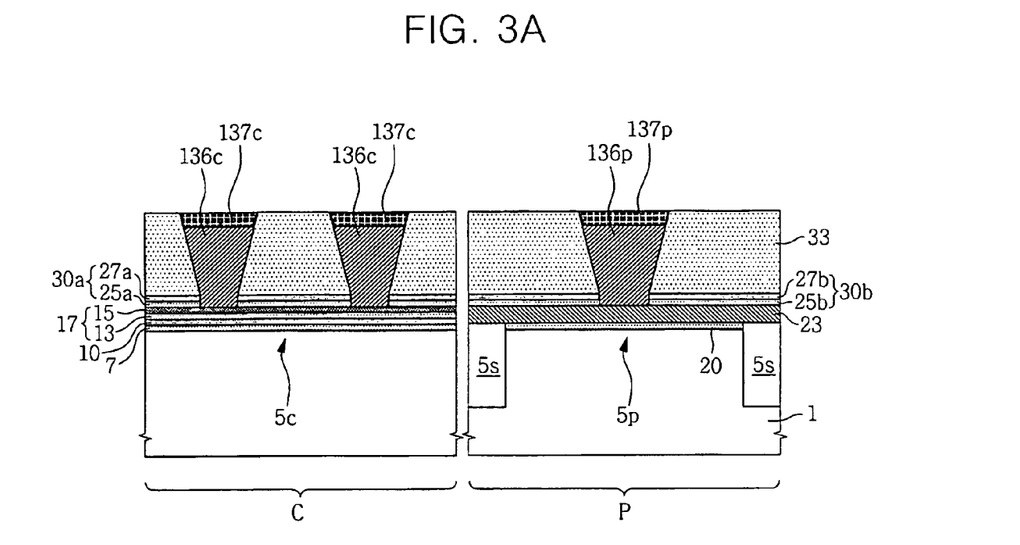
FIGS. 3A and 3B are cross-sectional views of a semiconductor device according to another example embodiment.
Figure 3B:
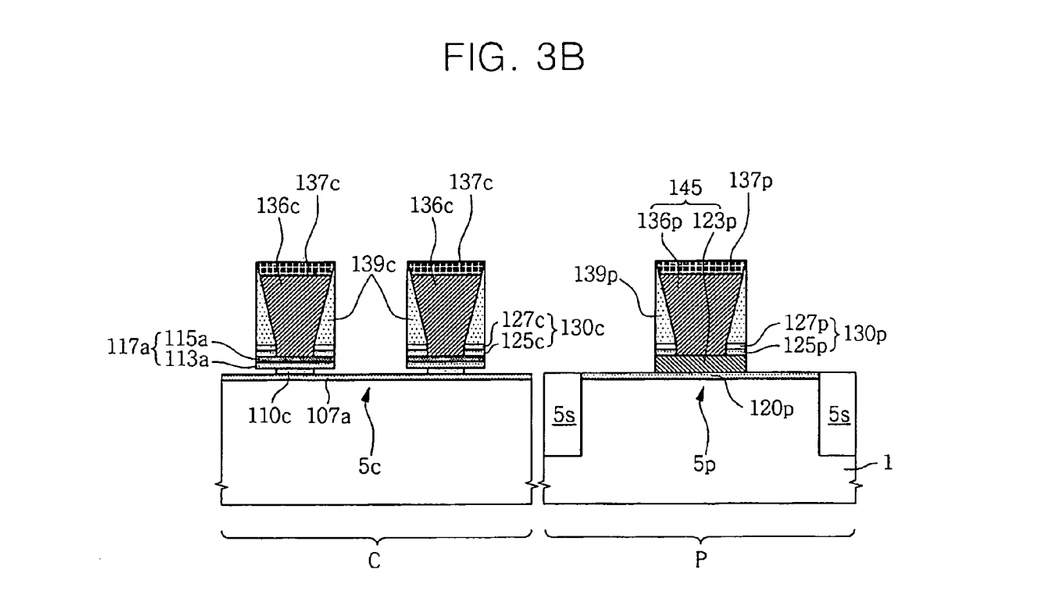

Referring to FIGS. 1 and 2A, a semiconductor substrate 1 including a cell array region CE and a peripheral circuit region PE may be prepared. The semiconductor substrate 1 may be a bulk wafer including a semiconductor material or silicon on insulator (SOI) wafer. The cell array region CE may be a memory cell array region of a non-volatile memory device (e.g., a flash memory device).

An isolation region 5s may be formed in the semiconductor substrate 1. For example, the isolation region 5s may be formed using a shallow trench isolation process. The isolation region 5s may define a cell active region 5c in the cell array region CE, and define a peripheral active region 5p in the peripheral circuit region PE.

A first dielectric layer 7, a data storage layer 10 and a second dielectric layer 17, which are sequentially stacked, may be formed on the cell active region 5c of the semiconductor substrate 1.

The first dielectric layer 7 may be a tunnel dielectric layer. The tunnel dielectric layer may include at least one selected from the group consisting of a silicon oxide layer, a silicon oxynitride (SiON) layer, a nitrogen doped Si oxide layer and a high-k dielectric layer. The high-k dielectric layer may include a dielectric layer having a higher dielectric constant than a silicon oxide layer (e.g., an aluminum (Al) oxide layer, a zirconium (Zr) oxide layer, a hafnium (Hf) oxide layer and a lanthanium (La) oxide layer).

The data storage layer 10 may be a data storage unit of a non-volatile memory device. For example, the data storage layer 10 may trap electrons to store data. The data storage layer 10 may include at least one selected from the group consisting of a SiON layer, a silicon nitride layer and a high-k dielectric layer. The data storage layer 10 may include nanocrystals. For example, the nanocrystals may be one selected from the group consisting of tungsten (W), titanium (Ti), tantalum (Ta), copper (Cu), molybdenum (Mo), nickel (Ni) and a nitride thereof. Also, the nanocrystals may be oxide nanocrystals. The oxide nanocrystals may include at least one selected from the group consisting of zirconium (Zr), hafnium (Hf), yttrium (Y) and aluminum (A). Further, the nanocrystals may be silicon nanocrystals, germanium (Ge) nanocrystals, silicon nitride nanocrystals, boron nanocrystals or boron nitride nanocrystals.

The second dielectric layer 17 may be a blocking dielectric layer. The second dielectric layer 17 may be formed to include a lower blocking layer 13 and an upper blocking layer 15, which are sequentially stacked. The lower blocking layer 13 may include a silicon oxide layer. The upper blocking layer 15 may include at least one high-k dielectric material.

A peripheral gate dielectric layer 20 and a lower peripheral gate conductive layer 23, which are sequentially stacked, may be formed on the peripheral active region 5p of the semiconductor substrate 1. The peripheral gate dielectric layer 20 may be formed to include at least one of a silicon oxide layer and a high-k dielectric layer. The lower peripheral gate conductive layer 23 may include a conductive material layer such as a doped silicon layer.

After the first dielectric layer 7, the data storage layer 10 and the second dielectric layer 17, which are sequentially stacked, are formed on the cell array region CE, a process of forming the peripheral gate dielectric layer 20 and the lower peripheral gate conductive layer 23 on the peripheral circuit region PE may be performed. Alternatively, after the peripheral gate dielectric layer 20 and the lower peripheral gate conductive layer 23 are formed on the peripheral circuit region PE, a process of forming the first dielectric layer 7, the data storage layer 10 and the second dielectric layer 17, which are sequentially stacked on the cell array region CE, may be performed.

A cell buffer layer 30a may be formed on the second dielectric layer 17. The cell buffer layer 30a may be formed to include a lower cell buffer layer 25a and an upper cell buffer layer 27a, which are sequentially stacked. The lower cell buffer layer 25a may be formed of a different material from the upper cell buffer layer 27a. For example, the lower cell buffer layer 25a may be formed of a silicon oxide layer, and the upper cell buffer layer 27a may be formed of a silicon nitride layer.

A peripheral buffer layer 30b may be formed on the lower peripheral gate conductive layer 23. The peripheral buffer layer 30b may be formed to include a lower peripheral buffer layer 25b and an upper peripheral buffer layer 27b, which are sequentially stacked.

In some example embodiments, the cell buffer layer 30a and the peripheral buffer layer 30b may be formed of the same material layer by the same process. For example, the cell buffer layer 30a and the peripheral buffer layer 30b may be formed on the substrate on which the second dielectric layer 17 and the lower peripheral gate conductive layer 23 are formed.

In other example embodiments, forming the cell buffer layer 30a and the peripheral buffer layer 30b may include forming a dielectric layer and a conductive layer on the entire surface of the semiconductor substrate, patterning the dielectric layer and the conductive layer to form the peripheral gate dielectric layer 20 and the lower peripheral gate conductive layer 23, which are sequentially stacked, on the peripheral circuit region PE, and forming the first dielectric layer 7, the data storage layer 10, the second dielectric layer 17 and a buffer layer, which are sequentially stacked, on the entire surface of the substrate of the resulting structure. Afterwards, the buffer layer, the second dielectric layer and the data storage layer on the peripheral circuit region PE among the first dielectric layer, the data storage layer, the second dielectric layer and the buffer layer, which are sequentially stacked on the lower peripheral gate conductive layer 23 of the peripheral circuit region PE, may be selectively etched by a photolithography and etching process. As a result, the first dielectric layer and the data storage layer remaining on the lower peripheral gate conductive layer 23 may be respectively defined as a lower peripheral buffer layer 25b and an upper peripheral buffer layer 27b, and the buffer layer on the cell array region CE may be defined as a cell buffer layer 30a.

Figure 2B:
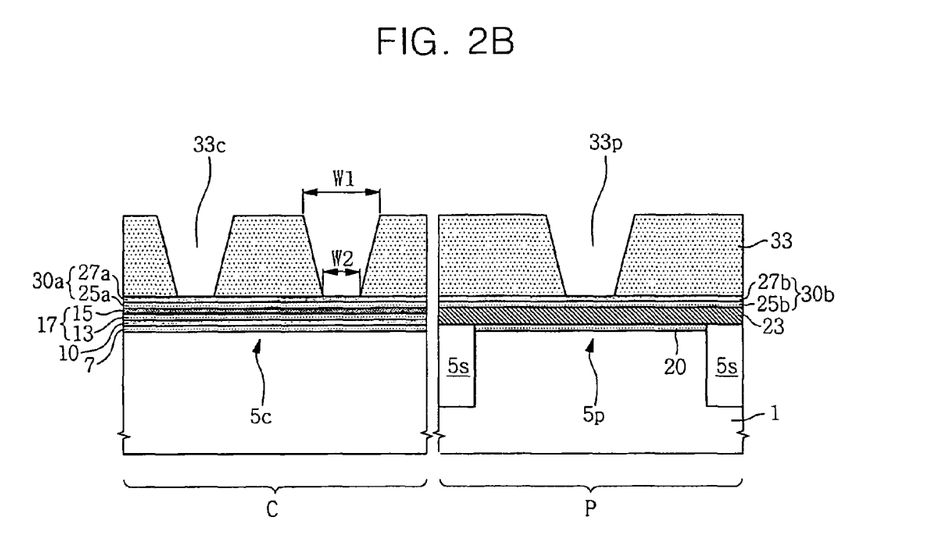

Referring to FIGS. 1 and 2B, a mask 33 may be formed on the substrate having the cell and peripheral buffer layers 30a and 30b. The mask 33 may have a first preliminary cell opening 33c exposing a region of the upper cell buffer layer 27a and a first preliminary peripheral opening 33p exposing a region of the upper peripheral buffer layer 27b. The mask 33 may be formed of a material layer having an etch selectivity with respect to the upper cell buffer layer 27a and the upper peripheral buffer layer 27b. For example, if the upper cell buffer layer 27a and the upper peripheral buffer layer 27b are formed of a silicon nitride layer, the mask 33 may be formed of an insulating material layer such as a silicon oxide layer.

Forming the first preliminary cell opening 33c and the first preliminary peripheral opening 33p may include performing a photolithography and etching process in which the upper cell buffer layer 27a and the upper peripheral buffer layer 27b are used as etch stop layers. Here, the etching process may include at least one of dry etching and wet etching.

In some example embodiments, each of the first preliminary cell opening 33c and the first preliminary peripheral opening 33p may be formed to have an inclined sidewall that narrows from an upper region towards a lower region. Thus, each of the first preliminary cell opening 33c and the first preliminary peripheral opening 33p may have an inverted trapezoidal shape. For example, the first preliminary cell opening 33c may be formed to have a first width W1 at the upper region and a second width W2 smaller than the first width W1 at the lower region.

In other example embodiments, each of the first preliminary cell opening 33c and the first preliminary peripheral opening 33p may be formed to have a substantially vertical sidewall. Thus, the mask 33 may have a rectangular or square shape.

Figure 2C:
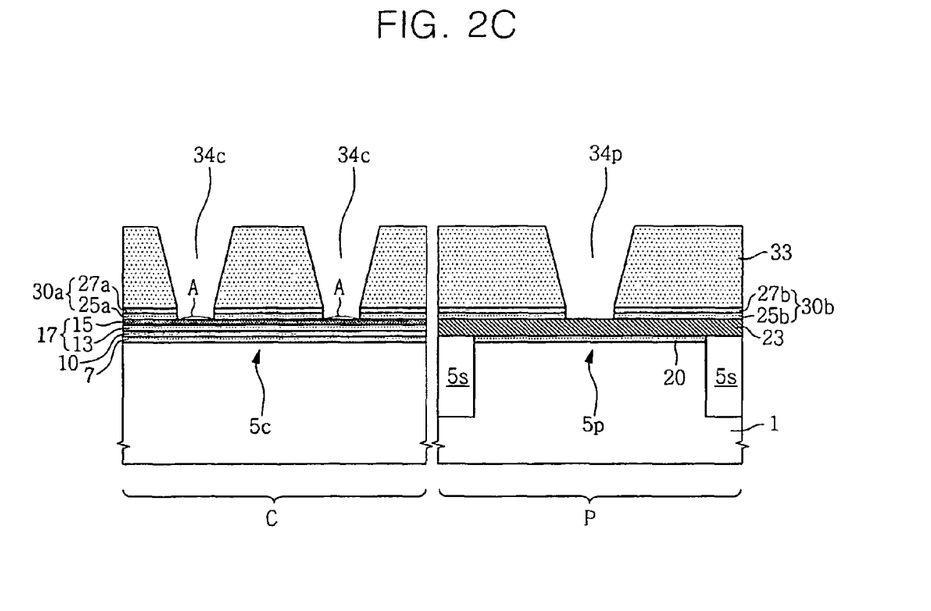

Referring to FIGS. 1 and 2C, the cell and peripheral buffer layers 30a and 30b exposed by the first preliminary cell opening 33c and the first preliminary peripheral opening 33p may be etched to expose a first region A of the second dielectric layer 17 on the cell array region CE and to expose a region of the lower peripheral gate conductive layer 23 of the peripheral circuit region PE. Therefore, a first cell opening 34c exposing the first region A of the second dielectric layer 17 may be formed and a first peripheral opening 34p exposing the region of the lower peripheral gate conductive layer 23 may be formed. Each of the first cell and peripheral openings 34c and 34p may be formed to have an inclined sidewall that narrows from an upper region towards a lower region at a region corresponding to each of the first preliminary cell and peripheral openings 33c and 33p. On the other hand, each of the first cell and peripheral openings 34c and 34p may be formed to have a substantially vertical sidewall at a region corresponding to each of the first preliminary cell and peripheral openings 33c and 33p.

In some example embodiments, etching the cell and peripheral buffer layers 30a and 30b exposed by the first preliminary cell and peripheral openings 33c and 33p may include an etching process that does not cause etch damage with respect to the second dielectric layer 17. For example, at least the lower cell buffer layer 25a and the peripheral buffer layer 25b of the cell and peripheral buffer layers 30a and 30b, respectively, may be etched using wet etching. Therefore, the resultant first region A of the second dielectric layer 17 exposed by the first cell opening 34c may be exposed without etch damage.

In the example embodiments, the cell and peripheral buffer layers 30a and 30b may be defined as a part of a mask. For example, the mask 33 may be defined as an upper mask and the cell and peripheral buffer layers 30a and 30b may be defined as lower masks.

Figure 2D:
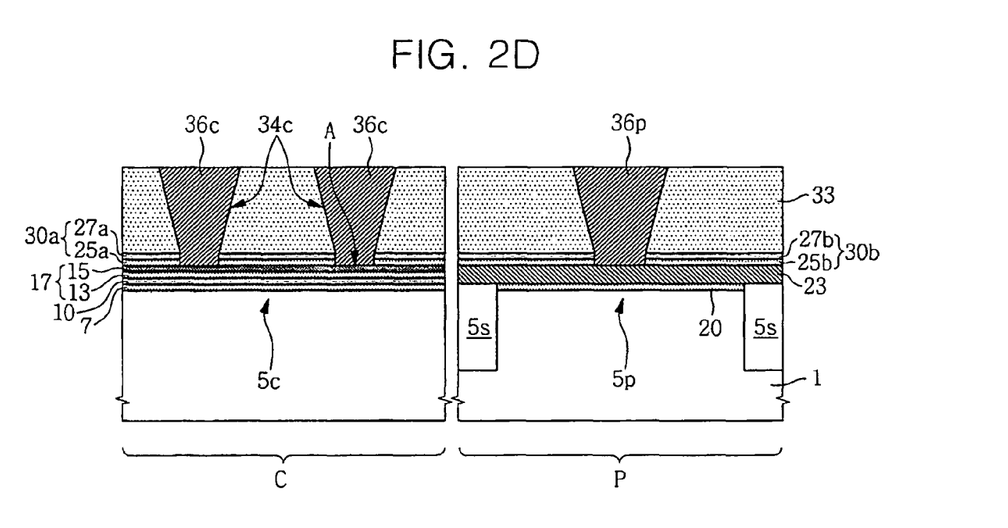

Referring to FIGS. 1 and 2D, a cell gate electrode 36c filling at least a part of the first cell opening 34c may be formed and an upper peripheral gate electrode 36p filling at least a part of the first peripheral opening 34p may be formed. Because each of the first cell and peripheral openings 34c and 34p may be formed to have an inclined sidewall that narrows from an upper region towards a lower region, the cell gate electrode 36c and the upper peripheral gate electrode 36p may each have an inclined sidewall that narrows from an upper region towards a lower region. Thus, the cell gate electrode 36c and the upper peripheral gate electrode 36p have an inverted trapezoidal shape, or a substantially inverted trapezoidal shape. The cell gate electrode 36c and the upper peripheral gate electrode 36p may be formed of the same conductive material. For example, forming the cell gate electrode 36c and the upper peripheral gate electrode 36p may include forming a gate conductive material layer on the substrate having the first cell and peripheral openings 34c and 34p, and planarizing the gate conductive material layer until an upper surface of the mask is exposed. The planarization may include a chemical mechanical polishing (CMP) process and/or an etch-back process. The gate conductive material layer may include at least one of a metal layer, a doped silicon layer, a metal nitride layer and a metal silicide layer. The metal layer may include a metallic element (e.g., titanium (Ti), tantalum (Ta), tungsten (W), molybdenum (Mo), cobalt (Co), aluminum (A), etc).

As described above, the cell gate electrode 36c is formed using a damascene process. Thus, even a conductive layer, on which a photolithography and etching process or a cleansing process are difficult to perform, may be used as the cell gate electrode 36c. Therefore, because the type of the conductive layer that can be selected as the cell gate electrode 36c varies, a conductive layer that has an appropriate work function may be used as the cell gate electrode 36c depending on characteristics of a device to be used.

Figure 2E:
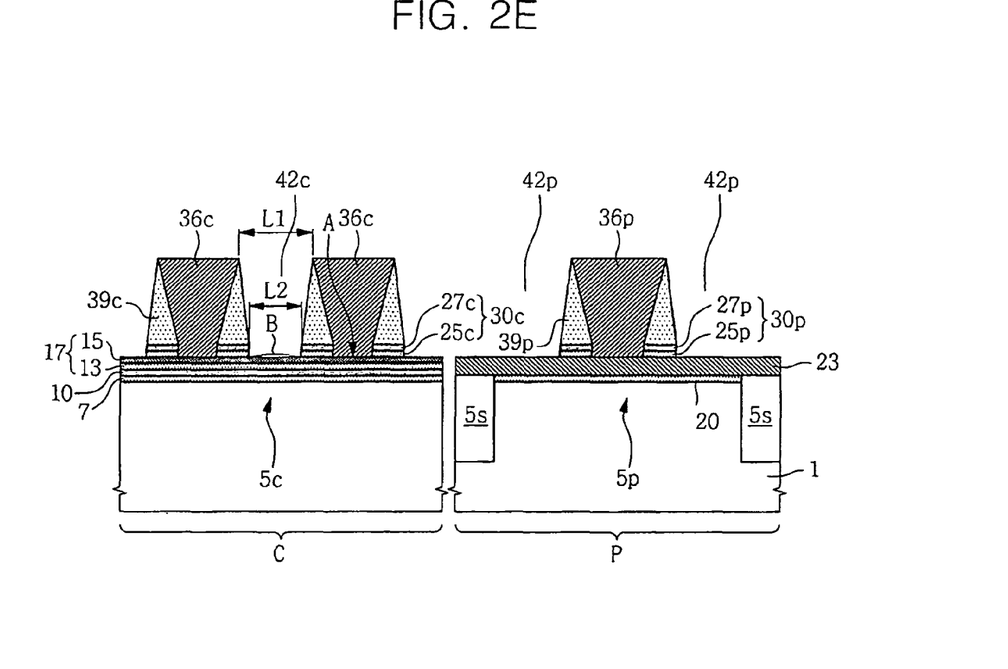

Referring to FIGS. 1 and 2E, the mask 33 of FIG. 2D and the buffer layers 30a and 30b may be etched using the cell gate electrode 36c and the upper peripheral gate electrode 36p as etch masks. As a result, a second cell opening 42c exposing a second region B of the second dielectric layer 17 may be formed in the cell array region CE, and a second peripheral opening 42p exposing a region of the lower peripheral gate conductive layer 23 may be formed in the peripheral circuit region PE. The second region B may be spaced apart from the first region A. Also, a portion of the mask 33 of FIG. 2D may remain on a sidewall of the cell gate electrode 36c to form a cell gate spacer 39c surrounding the sidewall of the cell gate electrode 36c and to form a peripheral gate spacer 39p surrounding a sidewall of the upper peripheral gate electrode 36p. Moreover, a portion of the cell buffer layer 30a of FIG. 2D may remain below the cell gate spacer 39c to form a cell buffer pattern 30c surrounding the remaining part of the sidewall of the cell gate electrode 36c. Further, a portion of the peripheral buffer layer 30b of FIG. 2D may remain below the peripheral gate spacer 39p to form a peripheral buffer pattern 30p surrounding the remaining part of the sidewall of the upper peripheral gate electrode 36p. The cell buffer pattern 30c may include a lower cell buffer pattern 25c and an upper cell buffer pattern 27c, which are sequentially stacked. The peripheral buffer pattern 30p may include a lower peripheral buffer pattern 25p and an upper peripheral buffer pattern 27p, which are sequentially stacked.

Therefore, the sidewall of the cell gate electrode 36c may be surrounded by the cell buffer pattern 30c and the cell gate spacer 39c, which are sequentially stacked. The upper peripheral gate electrode 36p may be surrounded by the peripheral buffer pattern 30p and the peripheral gate spacer 39p, which are sequentially stacked.

In some example embodiments, each of the second cell and peripheral openings 42c and 42p may be formed to have an inclined sidewall that narrows from an upper region towards a lower region. For example, the second cell opening 42c may be formed to have a third width L1 at an upper region and a fourth width L2 narrower than the third width L1 at a lower region.

In other example embodiments, if each of the first cell and peripheral openings 34c and 34p of FIG. 2C is formed to have an inclined sidewall that narrows from an upper region towards a lower region, each of the second cell and peripheral cells 42c and 42p may be formed to have a substantially vertical sidewall. That is, at least one of the first cell opening 34c of FIG. 2C and the second cell opening 42c is formed to have an inclined sidewall that narrows from an upper region towards a lower region, so that the cell gate spacer 39c surrounding the sidewall of the cell gate electrode 36c may be formed.

Figure 2F:
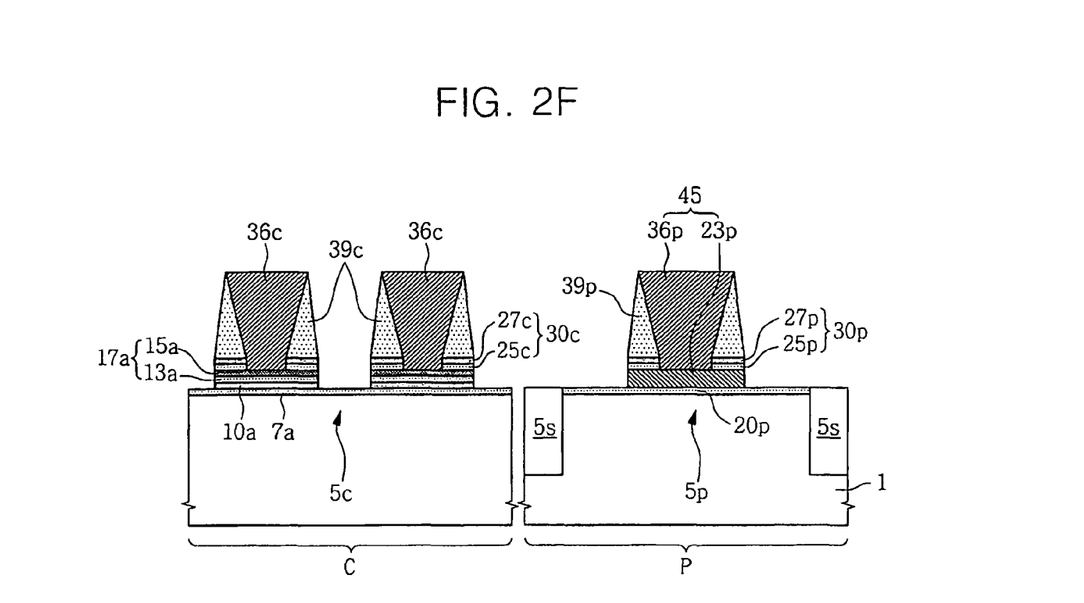

Referring to FIGS. 1 and 2F, the lower peripheral gate conductive layer 23 of FIG. 2D of the peripheral circuit region PE may be etched using the upper peripheral gate electrode 36p and the peripheral gate spacer 39p as etch masks to form a lower peripheral gate electrode 23p. The peripheral gate dielectric layer 20 between the lower peripheral gate electrode 23p and the peripheral active region 5p may be defined as a peripheral gate dielectric pattern 20p. The lower peripheral gate electrode 23p and the upper peripheral gate electrode 36p may form a peripheral gate electrode 45.

The second dielectric layer 17 of FIG. 2E and the data storage layer 10 of FIG. 2E may be sequentially etched using the cell gate electrode 36c and the cell gate spacer 39c as etch masks to form a data storage pattern 10a and a second dielectric pattern 17a, which are sequentially stacked. The first dielectric layer 7 between the data storage pattern 10a and the cell active region 5c may be defined as a first dielectric pattern 7a.

In some example embodiments, a process of sequentially etching the second dielectric layer 17 of FIG. 2E and the data storage layer 10 of FIG. 2E may be performed after, or before, etching the lower peripheral gate conductive layer 23.

The second dielectric pattern 17a may be formed to have a greater width than a lower surface of the cell gate electrode 36c. Therefore, undesired leakage current between the data storage pattern 10a and the cell gate electrode 36c may be prevented or reduced.

Figure 2G:
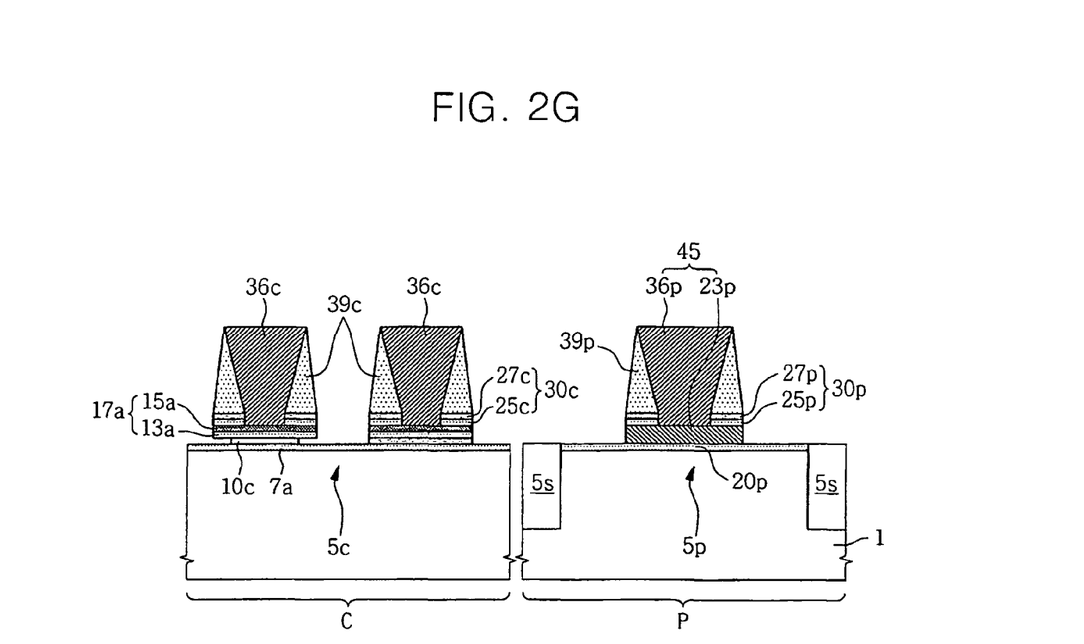

The example embodiments are not limited to the data storage pattern 10a described with reference to FIG. 2F, and may be embodied as the data storage pattern 10c illustrated in FIG. 2G. Referring to FIG. 2G, an etching process to reduce the width of the data storage pattern 10a of FIG. 2F is performed to form the data storage pattern 10c having a smaller width than the second dielectric pattern 17a. Therefore, not only does the lower region of the cell gate electrode 36c have a narrower width than the second dielectric pattern 17a, but the data storage pattern 10c has a smaller width than the second dielectric pattern 17a. Thus, undesired leakage current between the data storage pattern 10c and the cell gate electrode 36c can be more effectively prevented or reduced.

The disclosure is not limited to the above-described example embodiments and can be embodied in different forms. The example embodiments embodied in different forms will be described below with reference to FIGS. 3A, 3B and 4A to 4D.

First, a method of fabricating a semiconductor device according to another example embodiment will be described with reference to FIGS. 3A and 3B.

Referring to FIGS. 1 and 3A, a substrate may be prepared using the method of fabricating a semiconductor device described with reference to FIGS. 2A to 2C. That is, the substrate may be prepared up to forming the first cell and peripheral openings 34c and 34p. A cell gate electrode 136c partially filling the first cell opening 34c may be formed. An upper peripheral gate electrode 136p partially filling the first peripheral opening 34p may be formed.

A cell capping pattern 137c filling the remaining part of the first cell opening 34c may be formed on the cell gate electrode 136c. A peripheral capping pattern 137p filling the remaining part of the first peripheral opening 34p may be formed on the upper peripheral gate electrode 136p. Forming the cell capping pattern 137c and the peripheral capping pattern 137p may include forming an insulating material layer on the substrate having the cell gate electrode 136c and the upper peripheral gate electrode 136p, and planarizing the insulating material layer until an upper surface of the mask 33 is exposed. The cell and peripheral capping patterns 137c and 137p may be formed of an insulating material having an etch selectivity with respect to the mask 33. For example, if the mask 33 is formed of a silicon nitride layer, the cell and peripheral capping patterns 137c and 137p may be formed of a silicon oxide layer. Alternatively, if the mask 33 is formed of a silicon oxide layer, the cell and peripheral capping patterns 137c and 137p may be formed of a silicon nitride layer.

Referring to FIGS. 1 and 3B, using substantially the same method as that described with reference to FIG. 2E, the mask 33 may be etched using the cell capping pattern 137c and the peripheral capping pattern 137p as etch masks, and the cell buffer layer 30a and the peripheral buffer layer 30b below the mask 33 may be etched. As a result, openings corresponding to the second cell and peripheral openings 42c and 42p described in FIG. 2E may be formed. Each of the openings may be formed to have an inclined sidewall that narrows from an upper region towards a lower region, or to have a substantially vertical sidewall. Moreover, a cell gate spacer 139c and a peripheral gate spacer 139p that respectively correspond to the cell gate spacer 39c and the peripheral gate spacer 39p described with reference to FIG. 2E may be formed. Furthermore, a cell buffer pattern 130c may be formed below the cell gate spacer 139c, and a peripheral buffer pattern 130p may be formed below the peripheral gate spacer 139p. The cell buffer pattern 130c may include a lower cell buffer pattern 125c and an upper cell buffer pattern 127c, which are sequentially stacked. The peripheral buffer pattern 130p may include a lower peripheral buffer pattern 125p and an upper peripheral buffer pattern 127p, which are sequentially stacked.

The cell buffer pattern 130c and the cell gate spacer 139c, which are sequentially stacked, may be formed to surround the sidewall of the cell gate electrode 136c. The peripheral buffer pattern 130p and the peripheral gate spacer 139p, which are sequentially stacked, may be formed to surround the peripheral gate electrode 136p.

The second dielectric layer 17 of FIG. 3A and the data storage layer 10 of FIG. 3A may be etched using the cell capping pattern 137c and the cell gate spacer 139c as etch masks to form a data storage pattern 110c and a second dielectric pattern 117a, which are sequentially stacked. The first dielectric layer between the data storage pattern 110c and the cell active region 5c may be defined as a first dielectric pattern 107a.

Like the data storage pattern 10a described with reference to FIG. 2F, the data storage pattern 110c may be formed to have substantially the same width as the second dielectric pattern 117a. Alternatively, like the data storage pattern 10c described in FIG. 2G, the data storage pattern 110c may be formed to have a smaller width than the second dielectric pattern 117a.

The lower peripheral gate conductive layer 23 of FIG. 3A of the peripheral circuit region PE may be etched using the upper peripheral capping pattern 137p and the peripheral gate spacer 139p as etch masks to form a lower peripheral gate electrode 123p. The lower peripheral gate electrode 123p and the upper peripheral gate electrode 136p may form a peripheral gate electrode 145. The peripheral gate dielectric layer between the lower peripheral gate electrode 123p and the peripheral active region 5p may be defined as a peripheral gate dielectric pattern 120p.

Next, a method of fabricating a semiconductor device according to still another example embodiment will be described below with reference to FIGS. 4A to 4D.

Figure 4A:
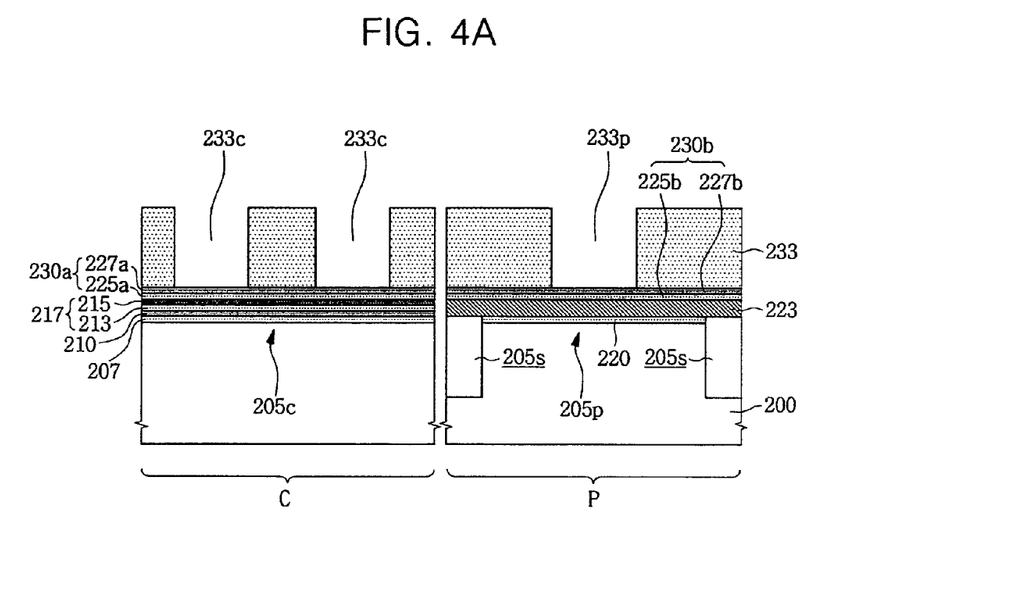
FIGS. 4A to 4D are cross-sectional views of a semiconductor device according to yet another example embodiment.

Referring to FIGS. 1 and 4A, a semiconductor substrate 200 including a cell array region CE and a peripheral circuit region PE may be prepared. An isolation region 205s may be formed in the semiconductor substrate 200. For example, the isolation region 205s may be formed using a shallow trench isolation process. The isolation region 205s may define a cell active region 205a in the cell array region CE and define a peripheral active region 205p in the peripheral circuit region PE.

Substantially the same method as that described in FIG. 2A may be performed such that a first dielectric layer 207, a data storage layer 210 and a second dielectric layer 217, which are sequentially stacked, may be formed on the isolation region 205s of the semiconductor substrate 200, and a peripheral gate dielectric layer 220 and a lower peripheral gate conductive layer 223, which are sequentially stacked, may be formed on the peripheral active region 205p of the semiconductor substrate 200. Further, a cell buffer layer 230a may be formed on the second dielectric layer 217, and a peripheral buffer layer 230b may be formed on the lower peripheral gate conductive layer 223. The cell buffer layer 230a may be formed to include a lower cell buffer layer 225a and an upper cell buffer layer 227a, which are sequentially stacked. The lower cell buffer layer 225a and the upper cell buffer layer 227a may be formed of different materials from each other. The peripheral buffer layer 230b may be formed to include a lower peripheral buffer layer 225b and an upper peripheral buffer layer 227b, which are sequentially stacked.

A mask 233 may be formed on the cell and peripheral buffer layers 230a and 230b. The mask 233 may have a first preliminary cell opening 233c exposing a region of the upper cell buffer layer 230a and a first preliminary peripheral opening 233p exposing a region of the peripheral buffer layer 230b. Forming the first preliminary cell opening 233c and the first preliminary peripheral opening 233p may include performing photolithography and etching processes in which the upper cell buffer layer 227a and the upper peripheral buffer layer 227b are used as etch stop layers. Here, the etching process may include at least one of dry etching and wet etching.

Figure 4B:
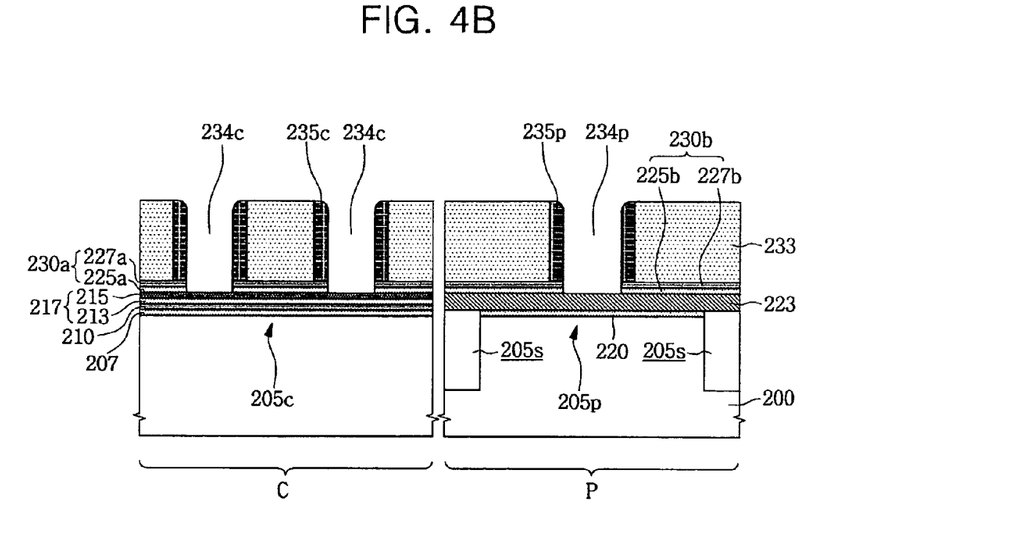

Referring to FIGS. 1 and 4B, a cell gate spacer 235c covering the sidewall of the first preliminary cell opening 233c may be formed and a peripheral gate spacer 235p covering the first preliminary peripheral opening 233p may be formed. The cell and peripheral gate spacers 235c and 235p may be formed of a material having an etch selectivity with respect to the mask 233. For example, if the mask 233 is formed of a silicon oxide layer, the cell and peripheral gate spacers 235c and 235p may be formed of a silicon nitride layer.

The cell and peripheral buffer layers 230a and 230b exposed by the first preliminary cell and peripheral openings 233c and 233p may be etched using the mask 233 and the cell and peripheral gate spacers 235c and 235p as etch masks. As a result, a first region of the second dielectric layer 217 on the cell array region CE may be exposed, and a region of the lower peripheral gate conductive layer 223 of the peripheral circuit region PE may be exposed. Therefore, a first cell opening 234c exposing the first region of the second dielectric layer 217 may be formed, and a first peripheral opening 234p exposing the region of the lower peripheral gate conductive layer 223 may be formed.

Etching the cell and peripheral buffer layers 230a and 230b exposed by the first preliminary cell and peripheral openings 233c and 233p may include an etching process that does not cause etch damage to the second dielectric layer 217. For example, at least the lower cell and peripheral buffer layers 225a and 225b of the cell and peripheral buffer layers 230a and 230b may be etched using a wet etching process. Therefore, the resultant first region of the second dielectric layer 217 exposed by the first cell opening 234c may be exposed without etch damage.

Figure 4C:
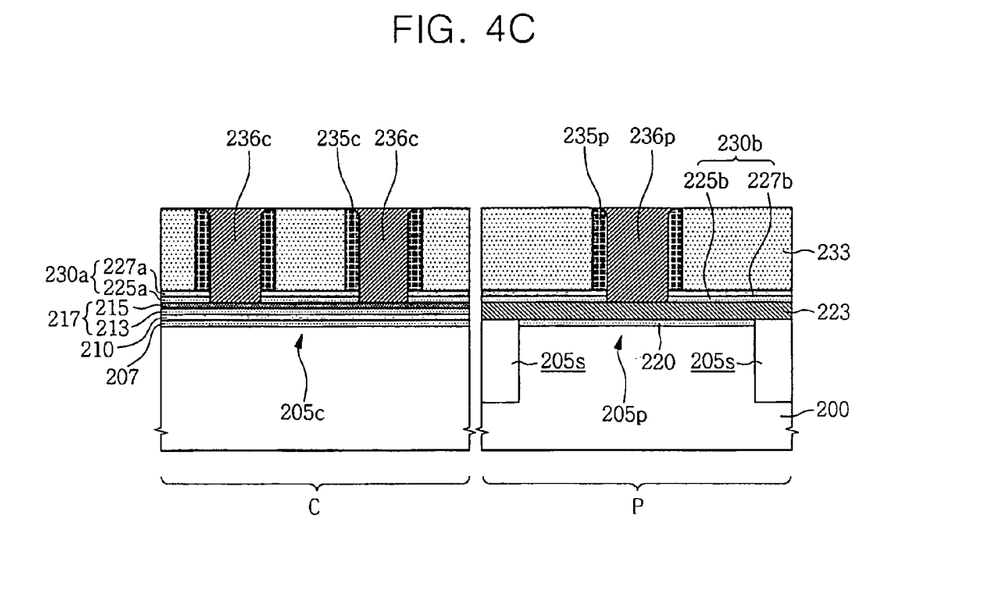

Referring to FIGS. 1 and 4C, using substantially the same method as that of forming the gate electrodes 36c and 36p described in FIG. 2D, a cell gate electrode 236c filling at least a part of the first cell opening 234c may be formed, and an upper peripheral gate electrode 236p filling at least a part of the first peripheral opening 234p may be formed.

In other example embodiments, as described with reference to FIG. 3A, the cell and peripheral gate electrodes 236c and 236p may be formed to fill a part of the first cell and peripheral openings 234c and 234p, and insulating capping patterns filling the remaining part of the first cell and peripheral openings 234c and 234p may be formed.

Figure 4D:
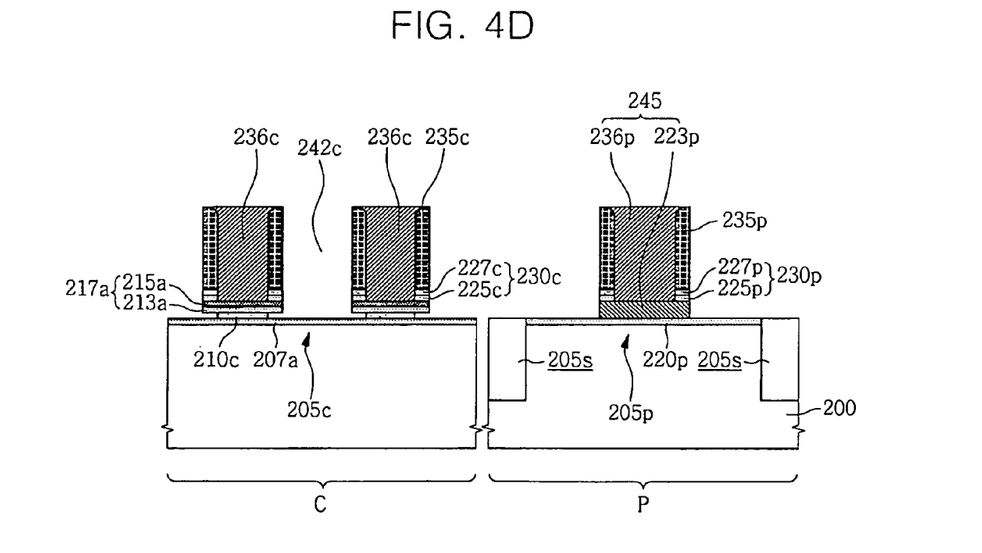

Referring to FIGS. 1 and 4D, the mask 233 of FIG. 4C and the cell and peripheral buffer layers 230a and 230b may be etched using the cell gate electrode 236c, the upper peripheral gate electrode 236p and the cell and peripheral gate spacers 235c and 235p as etch masks. As a result, a second cell opening 242c exposing a second region of the second dielectric layer 217 may be formed in the cell array region CE. In addition, a region of the lower peripheral gate conductive layer 223 may be exposed in the peripheral circuit region PE. The second region of the second dielectric layer 217 exposed by the second cell opening 242c may be spaced apart from the first region of the second dielectric layer 217 exposed by the first cell opening 233c of FIG. 4C.

A portion of the cell buffer layer 230a of FIG. 4C may remain below the cell gate spacer 235c to form a cell buffer pattern 230c surrounding the cell gate electrode 236c along with the cell gate spacer 235c. Likewise, the peripheral buffer layer 230b of FIG. 4C may remain below the peripheral gate spacer 235p to form a peripheral buffer pattern 230p surrounding the upper peripheral gate electrode 236p along with the peripheral gate spacer 235p. The cell buffer pattern 230c may include a lower cell buffer pattern 225c and an upper cell buffer pattern 227c, which are sequentially stacked. The peripheral buffer pattern 230p may include a lower peripheral buffer pattern 225p and an upper peripheral buffer pattern 227p, which are sequentially stacked.

The lower peripheral gate conductive layer 223 of FIG. 4C of the peripheral circuit region PE may be etched using the peripheral gate electrode 236p and the peripheral gate spacer 235p as etch masks to form a lower peripheral gate electrode 223p. The lower peripheral gate electrode 223p and the upper peripheral gate electrode 236p may form a peripheral gate electrode 245. The peripheral gate dielectric layer 220 between the lower peripheral gate electrode 223p and the peripheral active region 205p may be defined as a peripheral gate dielectric pattern 220p.

The second dielectric layer 217 of FIG. 4C and the data storage layer 210 of FIG. 4C may be sequentially etched using the cell gate electrode 236c and the cell gate spacer 235c as etch masks. Furthermore, an etching process of reducing the width of the etched data storage layer may be performed. As a result, a second dielectric pattern 217a having a greater width than a lower surface of the cell gate electrode 236c may be formed, and a data storage pattern 210c having a width equal to or smaller than the second dielectric pattern 217a may be formed. Therefore, undesired leakage current between the data storage pattern 210a and the cell gate electrode 236c may be prevented or reduced.

A portion of the first dielectric layer 207 between the data storage pattern 210a and the cell active region 205c may be defined as a first dielectric pattern 207a.

A process of sequentially etching the second dielectric layer 217 of FIG. 4C and the data storage layer 210 of FIG. 4C may be performed after, or before, etching the lower peripheral gate conductive layer 223.

According to example embodiments, between a data storage pattern and a gate electrode, a blocking dielectric pattern having a greater width than that of the gate electrode may be formed. Therefore, leakage current between the gate electrode and the data storage pattern may be prevented or reduced. Also, the gate electrode is formed using a damascene process such that even a conductive layer, on which a photolithography/etching or cleansing process cannot be readily performed, can be used as a gate electrode. Accordingly, because the type of conductive layer that can be selected as a gate electrode varies, a conductive layer having an appropriate work function may be used as a gate electrode depending on characteristics of a device to be used.

While example embodiments have been disclosed herein, it should be understood that other variations may be possible. Such variations are not to be regarded as a departure from the spirit and scope of example embodiments of the present application, and all such modifications as would be obvious to one skilled in the art are intended to be included within the scope of the following claims.

What is claimed is:

1. A method of fabricating a semiconductor device, comprising:
    forming a first dielectric layer, a data storage layer, and a second dielectric layer, which are sequentially stacked, over a semiconductor substrate;
    forming a mask over the second dielectric layer, the mask having a first opening exposing a first region of the second dielectric layer;
    forming a gate electrode filling at least a portion of the first opening in the mask;
    exposing a second region of the second dielectric layer by partially removing the mask, the second region being spaced apart from the first region, and the partially removed mask having inclined sidewalls which narrow from a lower region of the mask towards an upper region of the mask; and
    forming a second dielectric pattern and a data storage pattern by removing portions of the second dielectric layer and the data storage layer in the second region, the second dielectric pattern having a greater width than a lower surface of the gate electrode.

2. The method of claim 1, wherein the data storage layer is a charge trap layer of a non-volatile memory device.

3. The method of claim 2, wherein the non-volatile memory device is a flash memory device.

4. The method of claim 1, wherein the first opening has an inclined sidewall that narrows from the upper region of the mask towards the lower region of the mask.

5. The method of claim 1, wherein the first opening has a substantially vertical sidewall.

6. The method of claim 1, wherein the gate electrode has an inverted trapezoidal shape.

7. The method of claim 1, further comprising:
forming an insulating spacer on a sidewall of the first opening of the mask, prior to the forming of the gate electrode.

8. The method of claim 1, further comprising:
forming a buffer layer over the second dielectric layer prior to the forming of the mask.

9. The method of claim 8, wherein the forming of the first opening comprises:
etching the mask by performing a first etching process in which the buffer layer is used as an etch stop layer; and
etching the buffer layer by performing a second etching process in which the second dielectric layer is used as an etch stop layer.

10. The method of claim 9, wherein the first etching process includes at least one of dry etching and wet etching, and the second etching process includes wet etching.

11. The method of claim 1, further comprising:
forming a capping pattern over the gate electrode, wherein the gate electrode fills a lower portion of the first opening in the mask, and the capping pattern fills an upper portion of the first opening in the mask.

12. The method of claim 1, wherein the gate electrode completely fills the first opening in the mask.

13. The method of claim 1, wherein the forming of the gate electrode includes using a damascene process.

14. A method of fabricating a semiconductor device, comprising:
forming a first dielectric layer, a data storage layer, and a second dielectric layer, which are sequentially stacked, over a semiconductor substrate;
forming a mask over the second dielectric layer, the mask having a first opening exposing a first region of the second dielectric layer;
forming a gate electrode filling at least a portion of the first opening in the mask;
exposing a second region of the second dielectric layer by partially removing the mask, the second region being spaced apart from the first region, the partially removed mask having a substantially vertical sidewall; and
forming a second dielectric pattern and a data storage pattern by removing portions of the second dielectric layer and the data storage layer in the second region, the second dielectric pattern having a greater width than a lower surface of the gate electrode.

15. A method of fabricating a semiconductor device, comprising:
forming a first dielectric layer, a data storage layer, and a second dielectric layer, which are sequentially stacked, over a semiconductor substrate;
forming a mask over the second dielectric layer, the mask having a first opening exposing a first region of the second dielectric layer;
forming a gate electrode filling at least a portion of the first opening in the mask;
exposing a second region of the second dielectric layer by partially removing the mask, the second region being spaced apart from the first region;
forming a second dielectric pattern and a data storage pattern by removing portions of the second dielectric layer and the data storage layer in the second region, the second dielectric pattern having a greater width than a lower surface of the gate electrode; and
etching the data storage pattern such that the data storage pattern has a smaller width than the second dielectric pattern.

16. A method of fabricating a semiconductor device, comprising:
forming a first dielectric layer, a data storage layer, and a second dielectric layer, which are sequentially stacked, over a semiconductor substrate;
forming a mask over the second dielectric layer, the mask having a first opening exposing a first region of the second dielectric layer;
forming a gate electrode filling at least a portion of the first opening in the mask;
exposing a second region of the second dielectric layer by partially removing the mask, the second region being spaced apart from the first region and the partially removed mask is being configured as a gate spacer surrounding a sidewall of the gate electrode; and
forming a second dielectric pattern and a data storage pattern by removing portions of the second dielectric layer and the data storage layer in the second region, the second dielectric pattern having a greater width than a lower surface of the gate electrode.

17. A method of fabricating a semiconductor device, comprising:
forming a first dielectric layer, a data storage layer, and a second dielectric layer, which are sequentially stacked, over a semiconductor substrate;
forming a mask over the second dielectric layer;
patterning the mask to form a mask pattern that exposes a first region of the second dielectric layer;
forming a gate electrode in the first region of the second dielectric layer, an upper surface of the gate electrode being greater than a lower surface of the gate electrode;
partially removing the mask pattern to expose a second region of the second dielectric layer, the second region being spaced apart from the first region; and
forming a second dielectric pattern and a data storage pattern by removing portions of the second dielectric layer and the data storage layer in the second region, the second dielectric pattern having a greater width than the lower surface of the gate electrode.

18. The method of claim 17, wherein sidewalls of the gate electrode are not parallel.

* * * * *